United States Patent
Randazzo

(10) Patent No.: US 6,545,305 B1
(45) Date of Patent: Apr. 8, 2003

(54) LINEAR CAPACITOR AND PROCESS FOR MAKING SAME

(75) Inventor: Todd A. Randazzo, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/550,381

(22) Filed: Apr. 14, 2000

Related U.S. Application Data

(62) Division of application No. 09/074,837, filed on May 8, 1998, now Pat. No. 6,090,656.

(51) Int. Cl.⁷ .............................................. H01L 27/108
(52) U.S. Cl. ........................ 257/296; 257/306; 257/532
(58) Field of Search ................................. 257/296, 306, 257/532; 438/250, 253, 393, 396

(56) References Cited

U.S. PATENT DOCUMENTS

| | | | |
|---|---|---|---|
| 4,406,051 A | 9/1983 | Iizuka | 29/576 |
| 4,481,283 A | 11/1984 | Kerr et al. | 430/319 |
| 4,859,278 A | 8/1989 | Choi | 156/643 |
| 5,057,447 A | 10/1991 | Paterson | 437/43 |
| 5,108,941 A | 4/1992 | Paterson et al. | 437/47 |
| 5,244,825 A | 9/1993 | Coleman et al. | 437/919 |
| 5,338,701 A | 8/1994 | Hsu et al. | 437/60 |
| 5,393,691 A | 2/1995 | Hsu et al. | 437/60 |
| 5,425,392 A | 6/1995 | Thakur et al. | 437/174 |
| 5,429,981 A | 7/1995 | Gardner et al. | 437/60 |
| 5,436,177 A | 7/1995 | Zaccherini | 437/27 |
| 5,498,561 A | 3/1996 | Sakuma et al. | 437/52 |
| 5,508,221 A | 4/1996 | Kamiyama | 437/60 |
| 5,510,637 A | 4/1996 | Hsu et al. | 257/304 |
| 5,527,729 A | 6/1996 | Matsumoto et al. | 437/60 |
| 5,534,448 A | 7/1996 | Baldi | 437/34 |
| 5,576,240 A | 11/1996 | Radosevich et al. | 437/60 |
| 5,658,821 A | 8/1997 | Chen et al. | 438/396 |
| 5,674,771 A | 10/1997 | Machida et al. | 437/60 |
| 5,747,375 A | 5/1998 | Kaneko et al. | 438/396 |
| 5,789,303 A | 8/1998 | Leung et al. | 438/381 |

OTHER PUBLICATIONS

Wolf, Stanley; Silicon Processing for the VLSI Era; vol. 1: Process Technology; 1986; pp. 181–183.

Primary Examiner—Amir Zarabian
Assistant Examiner—Toniae M. Thomas
(74) Attorney, Agent, or Firm—Carstens, Yee & Cahoon, L.L.P.

(57) ABSTRACT

A capacitor that is a metal to polysilicon capacitor. The capacitor is fabricated by forming a field oxide layer on a substrate. Then, a polysilicon segment is formed on the field oxide layer. This polysilicon segment forms a polysilicon bottom plate for the capacitor. A dielectric layer is formed and planarized. An opening is made in the dielectric layer to expose a portion of the polysilicon segment. Then, an oxide layer is formed on exposed portions of the polysilicon segment. A metal segment is formed on the oxide layer over the opening, wherein the metal segment forms a top-plate for the semiconductor device.

20 Claims, 7 Drawing Sheets

LINEAR CAPACITOR AND PROCESS FOR MAKING SAME

This is a divisional application of application Ser. No. 09/074,837, filed May 8, 1998, now U.S. Pat. No. 6,090,656.

BACKGROUND OF THE INVENTION

1. Technical Field:

The present invention relates generally to semiconductor devices and in particular to a semiconductor capacitor. Still more particularly, the present invention relates to a linear capacitor and a process for fabricating the same.

2. Description of the Related Art:

Linear complementary metal oxide semiconductor (CMOS) products can benefit greatly from the availability of linear capacitors in which both terminals are isolated from the substrate and the voltage coefficient of capacitance in both directions are very small. Linear capacitors are useful for many applications, including filters, charge-redistribution networks, and compensation in standard two-stage amplifiers. The industry "workhorse" for linear capacitors in recent years has been the "poly-poly" or "polysilicon to polysilicon" capacitor. Integration of such capacitors has become increasingly difficult because the polysilicon doping is now often dictated by considerations in fabricating other devices.

In FIGS. 1A–1C, a known process for fabricating a linear capacitor is shown. In FIG. 1A, a substrate 100 with field oxide region 102 is formed thereon as shown. Substrate 100 is a semiconductor substrate, such as, silicon. Gate polysilicon layer 104 has been formed on exposed substrate 100 and field oxide region 102. An N+ implant or diffusion is performed on this layer.

In FIG. 1B, an oxide layer 106 is formed that will create a poly-poly oxide layer for the linear capacitor. Thereafter, a second polysilicon layer is deposited, doped, and etched to form polysilicon top-plate 108 for the linear capacitor. The doping that forms polysilicon top-plate 108 is performed as part of a N+ source/drain implant. Doping of polysilicon top-plate 108 may be realized by diffusion, implantation, or doping as this layer is deposited.

Thereafter, in FIG. 1C, exposed portions of oxide layer 106 are stripped and polysilicon layer 104 is patterned and etched to form gate structure 110 and polysilicon bottom-plate 112. Polysilicon bottom plate 112 forms the bottom portion of the linear capacitor.

In FIGS. 2A–2C, diagrams illustrating a known process for fabrication of a transistor and a linear capacitor are depicted. In FIG. 2A, substrate 200 is shown with field oxide region 202. A polysilicon layer has been deposited, patterned, and etched to form polysilicon bottom-plate 204.

Next, in FIG. 2B, gate oxidation is performed to form poly-poly oxide layer 206 for the linear capacitor. A second polysilicon layer is deposited, patterned, and then implanted with a N+ source/drain implant to form source/drain regions 208 and 210. Then the second polysilicon layer is etched to form polysilicon top-plate 212 and gate structure 214 as illustrated in FIG. 2C. The etching process also forms spacers 215 and 216, which are artifacts of the etching process.

If the poly-poly oxide is not formed at the same time as the gate oxidation, another photocut is required to strip active regions for gate oxidation. Additionally, the doping in polysilicon top-plate 212 is doped in the same step as that for gate structure 214. The amount of doping of the polysilicon layer forming polysilicon top gate is defined to optimize transistor and resistor performance, such as gate structure 214. The resistance with the doping is typically 70 ohms to 150 ohms, which is not enough resistance for the capacitor. Low enough doping levels result in nonlinearities in capacitance. In other words, the capacitance changes when a direct current voltage is applied to the capacitor. Therefore, it would be advantageous to have an improved linear capacitor.

SUMMARY OF THE INVENTION

The present invention provides a capacitor that is a metal to polysilicon capacitor. The capacitor is fabricated by forming a field oxide layer on a substrate. Then a polysilicon segment is formed on the field oxide layer. This polysilicon segment forms a polysilicon bottom plate for the capacitor. A dielectric layer is formed and planarized. An opening is made in the dielectric layer to expose a portion of the polysilicon segment, Then, a capacitor dielectric layer is formed on exposed portions of the polysilicon segment. A metal segment is formed on the capacitor dielectric layer over the opening, wherein the metal segment forms a top-plate for the semiconductor device.

Dopants may be implanted into the polysilicon segment through the opening prior to forming the capacitor dielectric layer to adjust the doping level to maximize performance of the capacitor.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1A:
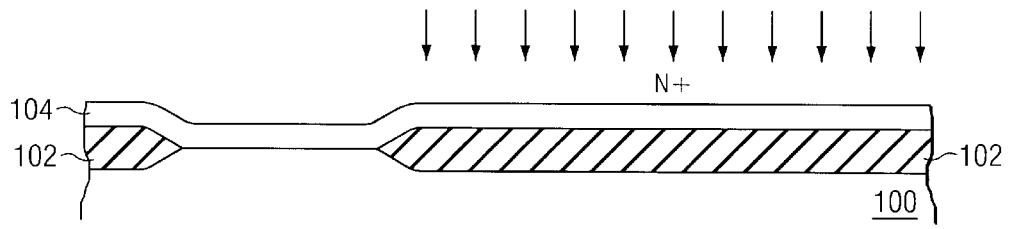
FIGS. 1A–1C are cross sectional diagrams illustrating a known process for fabricating a linear capacitor.
Figure 1B:
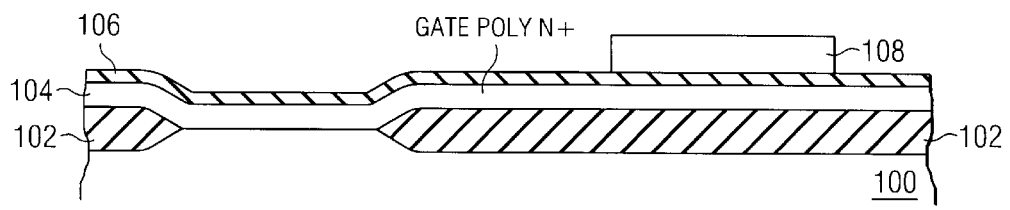
Figure 1C:
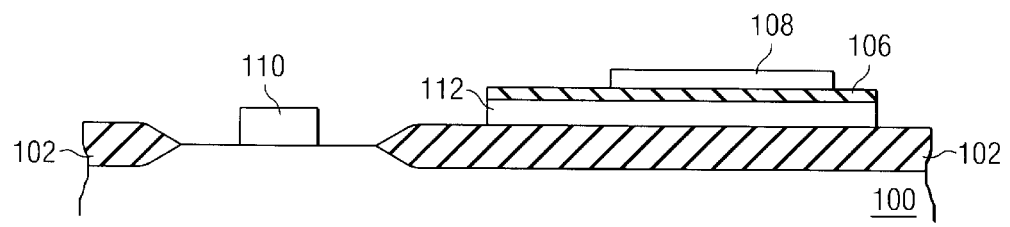
Figure 2A:
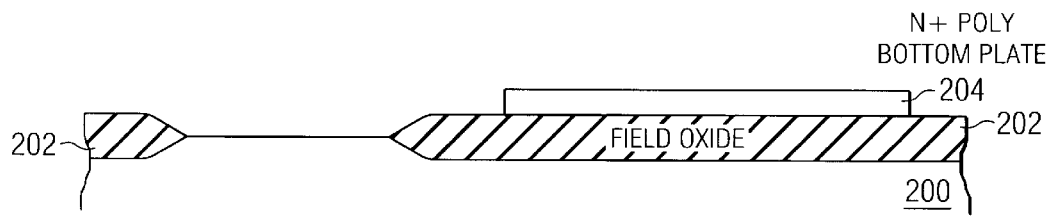
FIGS. 2A–2C are cross sectional diagrams illustrating a known process for fabrication of transistors and a linear capacitor.
Figure 2B:
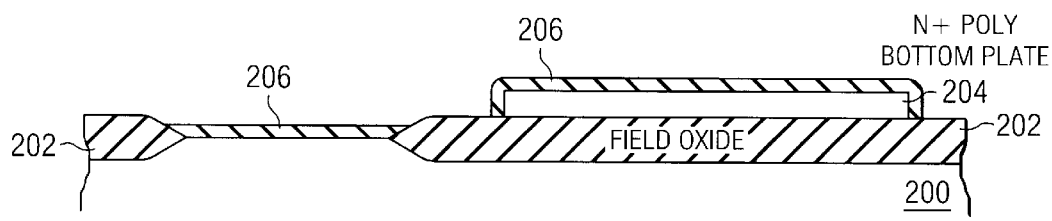
Figure 2C:
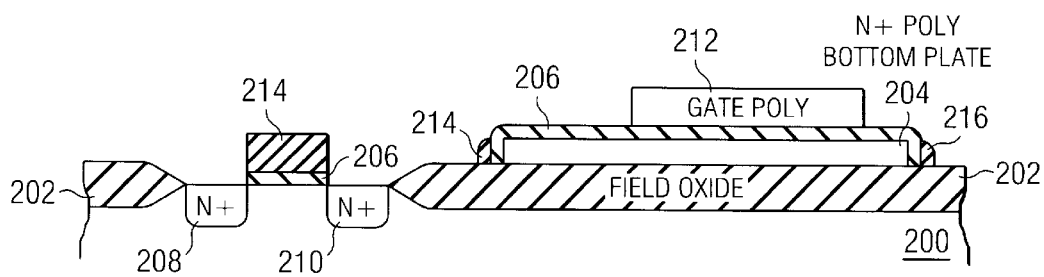
Figure 3A:
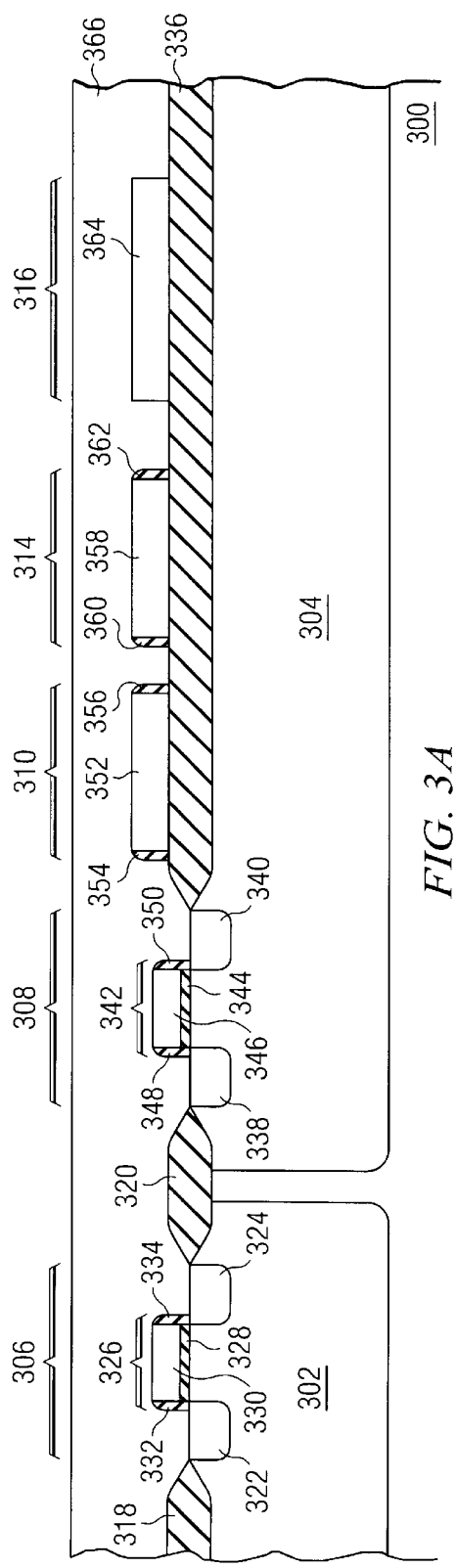
FIGS. 3A–3E are cross sectional diagrams illustrating a process for fabricating a metal-polysilicon capacitor in accordance with a preferred embodiment of the present invention.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention. Turning now to the figures and in particular to FIGS. 3A–3E, cross sectional diagrams illustrating a process for fabricating a metal-polysilicon capacitor are depicted in accordance with a preferred embodiment of the present invention. In FIG. 3A, substrate 300 includes a P well 302 and an N well 304 with a number of devices already formed within these two wells using known processes. Within P-well 302 is an N channel metal oxide semiconductor (NMOS) transistor 306. A P channel metal oxide semiconductor (PMOS) transistor 308, a N+ polysilicon resistor 310, and a P+ polysilicon resistor 314 are located within N well 304. Contacts for these devices remain to be manufactured in FIG. 3A. Also, within N well 304 is part of capacitor 316 in accordance with a preferred embodiment of the present invention. Capacitor 316 is a linear capacitor and is a metal to polysilicon capacitor in accordance with a preferred embodiment of the present invention.

NMOS transistor 306 is located between field oxide region 318 and field oxide region 320. NMOS transistor 306 includes source/drain regions 322 and 324. These source/drain regions are formed by implanting these regions with N type dopants. A gate structure 326 in transistor 306 includes gate oxide 328, polysilicon gate 330, sidewall spacer 332, and sidewall spacer 334. PMOS transistor 308 is located between field oxide region 320 and field oxide region 336 and includes source/drain regions 338 and 340 doped with P type dopants. Field oxide regions 318, 320, and 336 have a thickness from about 2000 Å to about 7000 Å in the depicted example. These field oxide regions may be formed through a number of different processes known to those of ordinary skill in the art, including shallow trench isolation or local oxidation of silicon (LOCOS). Gate structure 342 includes gate oxide 344, polysilicon gate 346, sidewall spacer 348, and sidewall spacer 350. N+ polysilicon resistor 310 is formed on field oxide region 336 with an N+ polysilicon layer 352. Sidewall spacer 354 and sidewall spacer 356 are located on either side of N+ polysilicon layer 352. P+ polysilicon resistor 314 is located on field oxide 336 and includes a P+ polysilicon layer 358 with sidewall spacer 360 and sidewall spacer 362 on either side of P+ polysilicon layer 358.

Only a portion of capacitor 316 has been formed in FIG. 3A. Polysilicon bottom-plate 364 is a N+ polysilicon layer formed on field oxide 336. Polysilicon bottom-plate 364 has a thickness from about 1200 Å to about 4000 Å in the depicted example. The same N+ polysilicon layer forming polysilicon bottom-plate 364 is used simultaneously for polysilicon gate 330 in NMOS transistor 306 and N+ polysilicon resistor 310. Dielectric layer 366 has been formed over all of the devices and planarized. This dielectric layer is a polysilicon to metal 1 dielectric. In the depicted example, dielectric layer 366 has a thickness from about 3000 Å to about 13,000 Å.

Figure 3B:
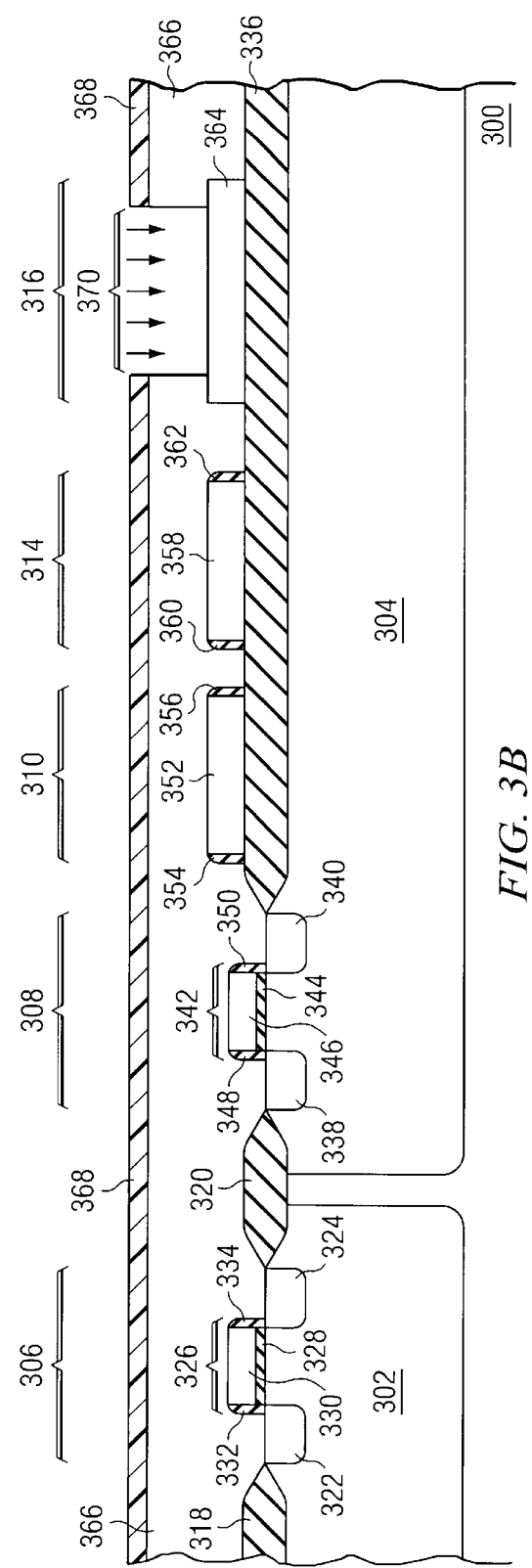

In FIG. 3B, a photoresist layer 368 has been formed over dielectric layer 366. This photoresist layer is used for a "capacitor cut" that is made into dielectric layer 366. Photoresist layer 368 is patterned and exposed. Then, opening or hole 370 is etched into dielectric layer to expose a portion of N+ polysilicon bottom-plate 364. The doping level in polysilicon bottom-plate 364 is set to optimize polysilicon gate 330 in NMOS transistor 306 and for N+ polysilicon resistor 310, which is in many cases too low for proper linear performance of capacitor 316. The resistance of polysilicon gate 330 is typically in a range from about 50 ohms/square to about 100 ohms/square, while the resistance of N+ polysilicon resistor 310 is typically in a range from about 70 ohms/square to about 150 ohms/square. In the depicted example, with photoresist layer 368 still in place, an N+ implant is made into N+ polysilicon bottom-plate 364 to selectively increase doping levels within N+ polysilicon bottom-plate 364. This implant is used to raise the dopant level within polysilicon bottom-plate 364 independently of the other devices without adding additional masks and masking steps.

Figure 3C:
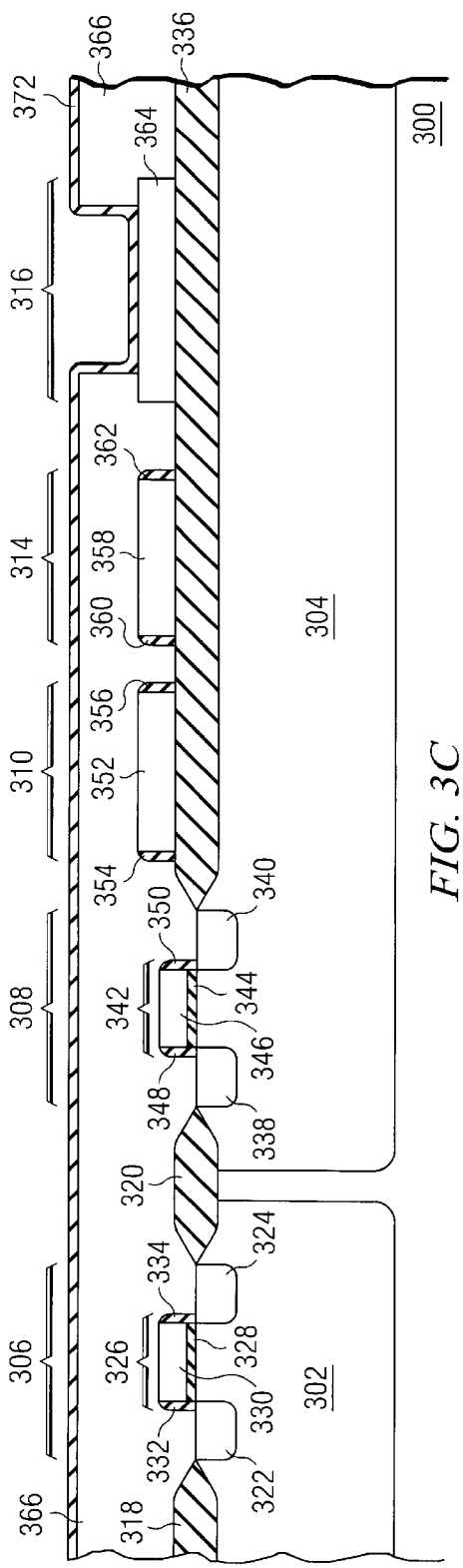

Next in FIG. 3C, photoresist layer 368 is stripped off and an option thermal activation of the implant may be performed after removal of photoresist layer 368 in accordance with a preferred embodiment of the present invention. Afterwards, capacitor oxide layer 372 is formed by depositing or growing the oxide. In the depicted example, this dielectric layer has a thickness from about 100 Å to about 400 Å. Capacitor oxide layer 372 may be formed in the depicted example using thermal oxidation or by depositing a TEOS film. With thermal oxidation, a thin silicon nitride layer of about 500 Å is deposited in the case that thermal oxidation is used to form capacitor oxide layer 372. Although, a capacitor oxide layer is used in the depicted example, other types of dielectric layers may be used in fabricating capacitor 316. For example, an oxide nitride oxide (ONO) stack may be used as a dielectric layer in place of capacitor oxide layer 372.

Figure 3D:
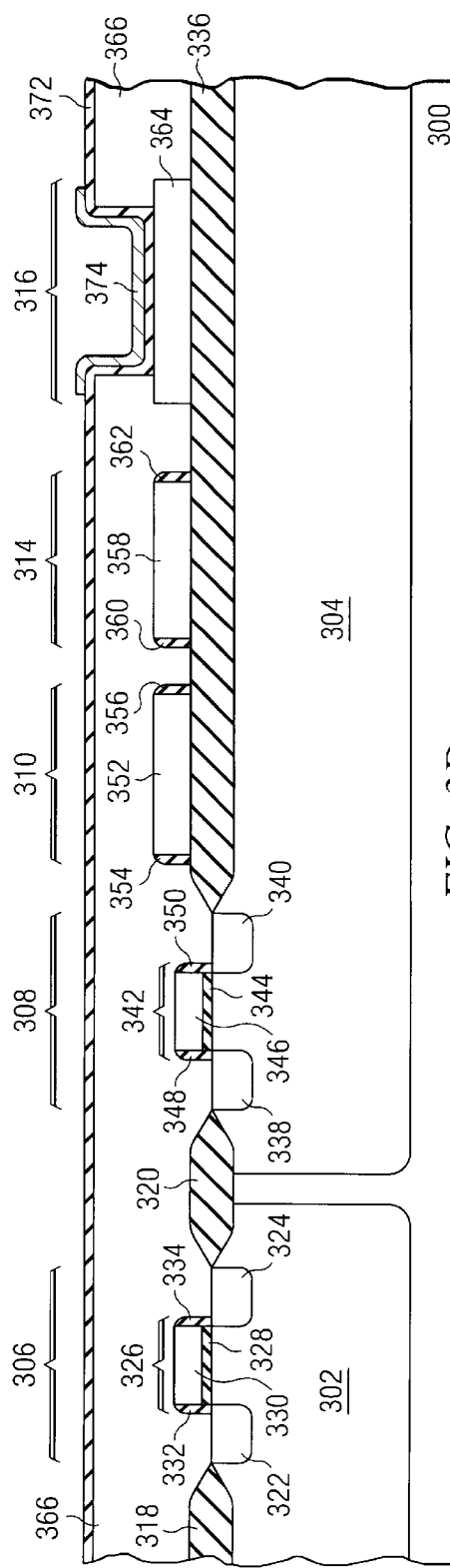

Thereafter, in FIG. 3D, a barrier metal layer is deposited and patterned over a portion of capacitor oxide layer 372 to form barrier 374 for N+ polysilicon capacitor 316. This barrier metal layer is used to protect the portion of capacitor oxide layer 372 over N+ polysilicon capacitor 316. The barrier metal used to form barrier 374 may be any standard barrier metal, such as, for example, titanium. Barrier 374 has a thickness from about 100 Å to about 500 Å in the depicted example. Barrier 374 forms a portion of top-plate for capacitor 316.

Figure 3E:
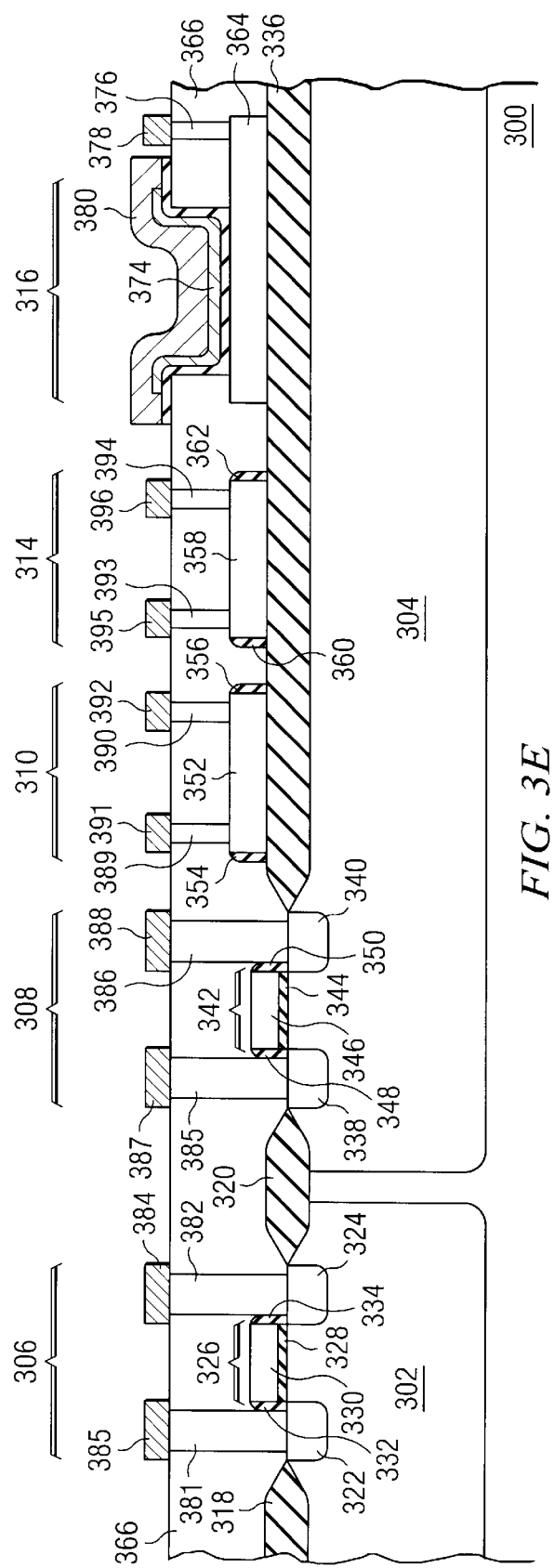

Next, in FIG. 3E, standard contact and metal 1 processing known to those of ordinary skill in the art is performed for the other devices to create contacts for the devices. During this processing, a hole is formed in dielectric layer 366 and a tungsten plug 376 is formed that contacts N+ polysilicon bottom-plate 364 to form capacitor 316. A metal contact 378 is then formed on tungsten plug 376. A metal segment 380 is formed in contact with barrier 374 to finish capacitor 316. Metal segment 380 is formed as part of the metal 1 processing that creates contacts for the other devices. Metal 1 is usually a stack of metal layers. As a result, metal segment 380 in the depicted example includes a bottom layer of Ti and TiN, which has a thickness from about 100 Å to about 1000 Å. A middle layer of Al, AlSi, or an Al/Cu alloy is employed having a thickness from about 4000 Å to about 8000 Å. Typically, this middle layer will be formed from an Al/Cu alloy. A top layer that forms a barrier layer also is found within metal segment 380 in the depicted example. This top layer is typically an anti-reflective layer formed from TiN and as a thickness from about 100 Å to about 700 Å. Metal segment 380 forms the remaining portion of the top-plate of capacitor 316, while metal contact 378 forms a contact for the bottom of capacitor 316. Barrier 374 is used to prevent removal of capacitor oxide layer 372 during the cleaning process used in ensuring good contact for the metal 1 layer. If damage to capacitor oxide layer 372 was not an issue, barrier 374 would not be needed and the top metal plate would be formed solely by metal segment 380. In the depicted example, another metal layer is used to form the contact for the top-plate, which includes barrier 374 and metal segment 380.

As can be seen in FIG. 3E, tungsten plugs 381 and 382 are formed for NMOS transistor 306 with contacts 383 and 384 to provide connections to source/drains 322 and 324. Tungsten plugs 385 and 386 in conjunction with metal contacts 387 and 388 are formed during metal 1 processing to provide connections to source/drains 338 and 340 for PMOS transistor 308. Tungsten plugs 389 and 390 with metal contacts 391 and 392 provide connections for N+ polysilicon resistor 310 while tungsten plugs 393 and 394 with metal contacts 395 and 396 form connections to P+ polysilicon resistor 314.

Figure 4A:
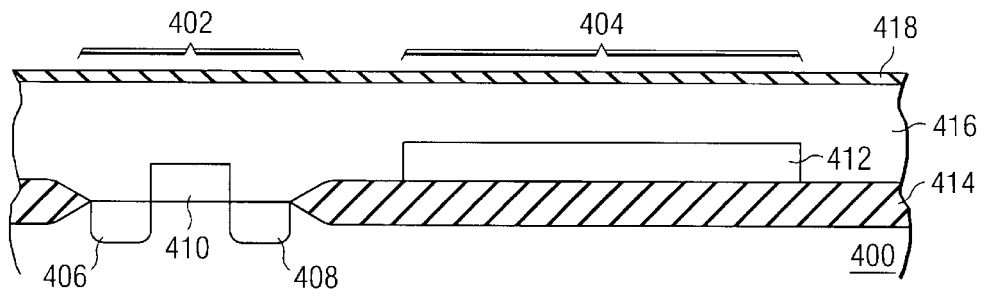
FIGS. 4A–4C are cross sectional diagrams illustrating a process for manufacturing a linear capacitor in accordance with a preferred embodiment of the present invention.
Figure 4B:
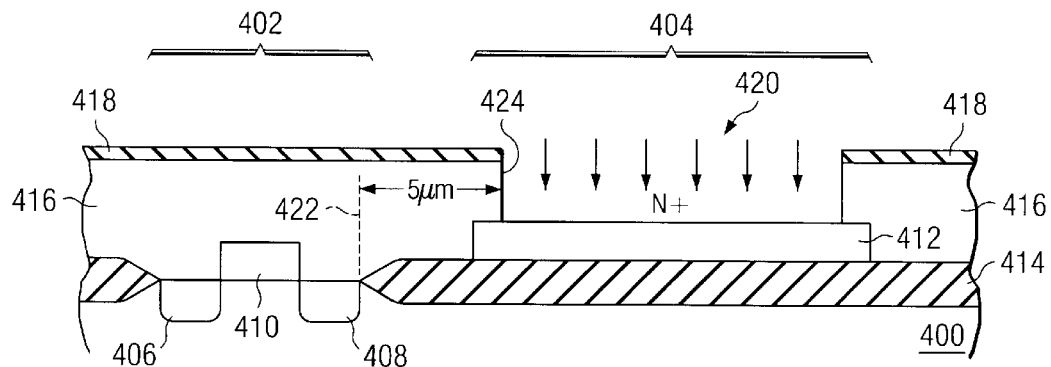
Figure 4C:
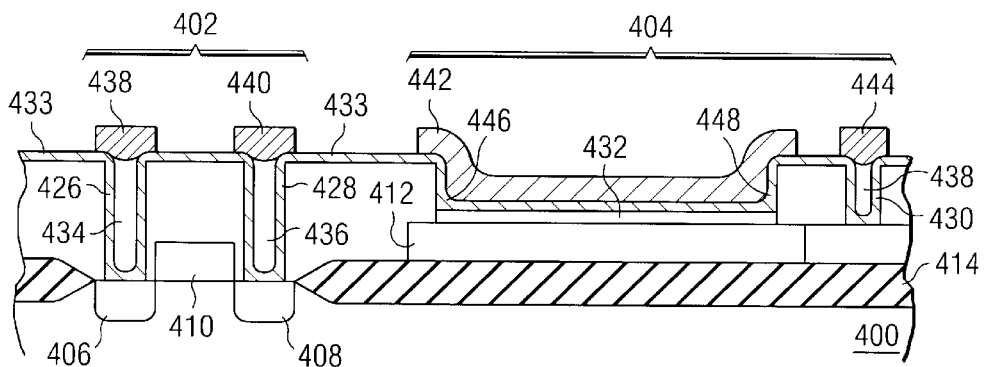

Turning next to FIGS. 4A–4C, cross sectional diagrams illustrating a process for manufacturing a linear capacitor are illustrated in accordance with a preferred embodiment of the present invention. In the depicted example, substrate 400 includes transistor 402 located next to capacitor 404. In FIG. 4A, source/drain 406, source/drain 408, and gate 410 have been formed for transistor 402. Polysilicon section 412 has been formed on field oxide 414 for capacitor 404. Polysilicon section 412 is formed from a gate polysilicon layer that was selective etched to form both polysilicon section 412 and gate 410. A dielectric layer 416 has been deposited and planarized over the devices. Dielectric layer 416 is a metal 1 to polysilicon dielectric layer in the depicted example. A silicon nitride ($Si_3N_4$) layer 418 having a thickness of about 500 Å has been formed on dielectric layer 416.

Next, in FIG. 4B, a "capacitor cut" has been performed by selectively etching silicon nitride layer 418 and dielectric layer 416, forming opening 420 to expose a portion of polysilicon section 412. In the depicted example, a distance of 5 $\mu$m is present between edge 422 of field oxide 414 and edge 424 of dielectric layer 416. With the thickness of silicon nitride layer 418 and dielectric layer 416 preventing dopants from reaching devices not exposed by etching, a self-aligned linearity implant may be performed to adjust the doping within polysilicon section 412. Alternatively, dopants may be diffused into polysilicon section 412.

Next in FIG. 4C, capacitor dielectric layer 432 is formed with silicon nitride layer 418 being removed after formation of capacitor dielectric layer 432. In the depicted example, capacitor dielectric layer 432 is formed using thermal oxidation. Other processes may be used to form capacitor dielectric layer 432 using TEOS deposition, which would not require the use of silicon nitride layer 418. For example, an ONO stack may be used to form capacitor dielectric layer 432. The silicon nitride layer is removed using hot $PHO_2$ in the depicted example. Holes 426 and 428 have been etched for connecting source/drain 406. Hole 430 has been etched to form a connection for polysilicon section 412, the polysilicon bottom-plate for capacitor 404. Barrier metal layer 433 is deposited prior to metal 1 processing. Tungsten plugs 434, 436, and 438 are formed. Then metal is deposited and patterned to form contacts 438 and 440 for transistor 402. The depositing and patterning of the metal layer forms metal segment 442 and forms contact 444 for capacitor 404. Barrier metal layer 433 along with metal segment 442 forms the top metal plate for capacitor 404. Barrier metal layer 433 provides protection for capacitor dielectric layer 432 during the cleaning process used to ensure good contact for the deposition of metal 1. If damage to capacitor dielectric layer 432 is not an issue, barrier metal layer 433 may be omitted. In this situation, the metal top-plate for capacitor 404 is formed by metal segment 442. Tungsten sidewalls 446 and 448 are present within capacitor 404 as artifacts left from forming tungsten plugs. Metal contact for the metal top-plate is formed in subsequent metal layer processing.

Figure 5:
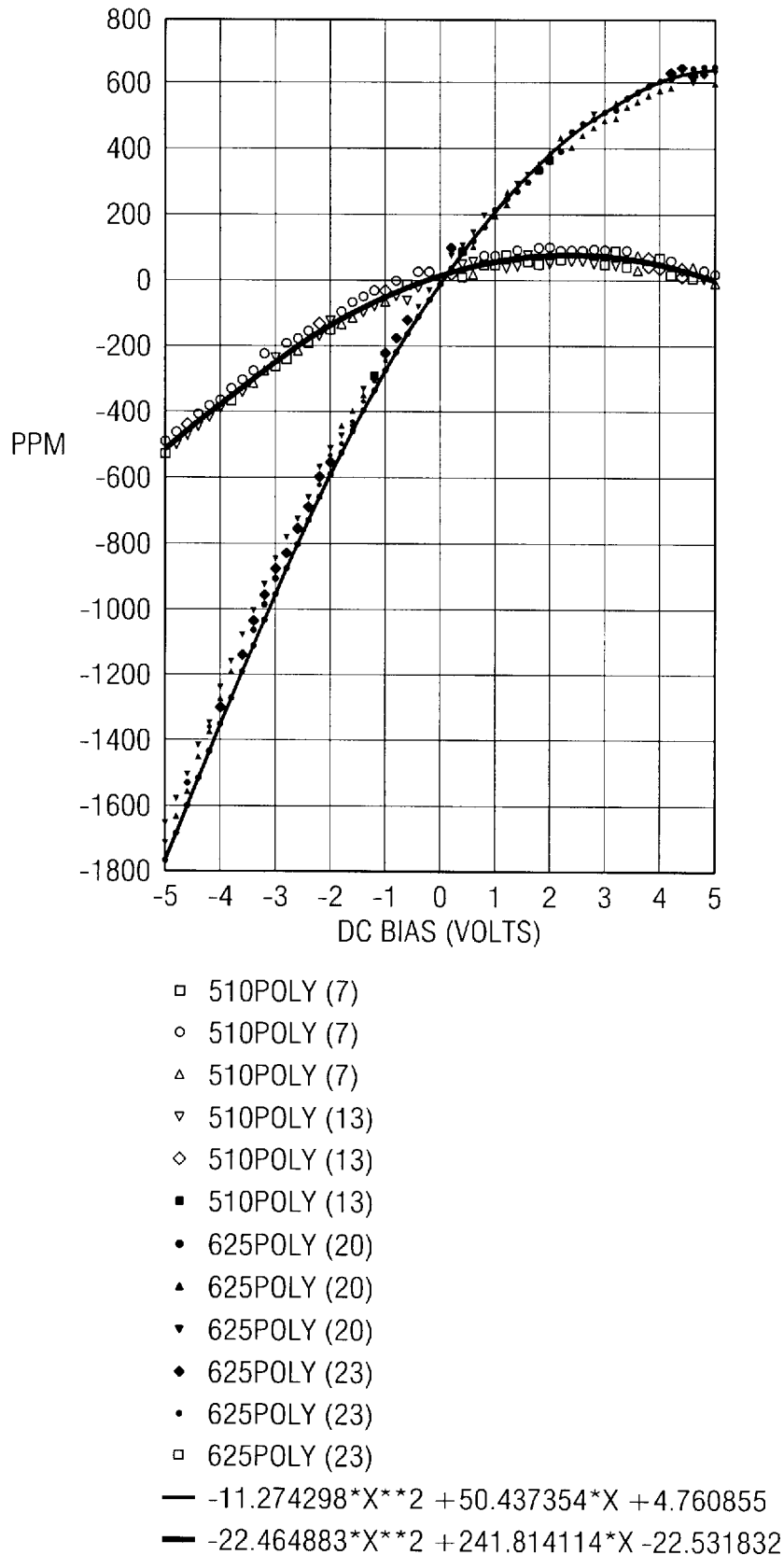
FIG. 5 is a diagram of test results showing sensitivity of capacitors to bottom-plate doping variations.

FIG. 5 is a diagram of test results showing sensitivity of capacitors to variations in bottom-plate doping. The y axis is used to indicate the deviation from zero DC bias capacitance in parts per million (PPM) while the x axis shows the change in DC bias voltage in volts. Increased doping in the bottom plate results in a flatter curve. Decreased doping results in more variation in the curve as DC bias voltage is changed. Curve 500 contains data for CMOS polysilicon to polysilicon capacitors manufactured using known processes that optimizes doping of the bottom-plate for that of transistors and resistors. These capacitors represented in curve 502 also are polysilicon to polysilicon capacitors that have a polysilicon bottom-plate optimized just for the capacitor. Curve 502, which is a good curve, has a flatter response rather than curve 500, which is a bad curve. The results indicate that the linearity is degraded by a factor of two, taking into account film densities, when the polysilicon bottom-plate of a capacitor is optimized for transistors and resistors instead of the capacitor.

Thus, the present invention provides an improved capacitor that is a metal to polysilicon capacitor. Additionally, the present invention provides a self-aligned linearity implant, which allows separate optimization of the capacitor doping from other devices, such as gate doping. This self-aligned implant does not require an additional photoresist masking step to increase the doping in the polysilicon bottom-plate of the linear capacitor.

The description of the present invention has been presented for purposes of illustration and description, but is not limited to be exhaustive or limited to the invention in the form disclosed. Many modifications and variations will be apparent to those of ordinary skill in the art. For example, although the capacitor employed a N+ polysilicon bottom, a type bottom-plate may be used depending on the implementation. In addition, the terms "top plate" and "bottom plate" are used to indicate relative positions between these two elements in the depicted examples, and the terms could be reversed. The embodiment was chosen and described in order to best explain the principles of the invention the practical application to enable others of ordinary skill in the art to understand the invention for various embodiments with various modifications as are suited to the particular use contemplated.

What is claimed is:

1. A capacitor in a semiconductor device, comprising:
   a substrate;
   a field oxide layer formed in the substrate;
   a polysilicon segment formed on the oxide layer;
   a first dielectric layer formed on the field oxide layer and the polysilicon segment;
   a second dielectric layer having a first side and a second side, the first side being substantially in contact with the polysilicon segment and the second side being in contact with a top-plate of the capacitor; and
   a contact to the portion of the polysilicon segment out of contact with the second dielectric layer.

2. The capacitor claim 1, wherein the field oxide layer has a thickness from about 2000 Angstroms to about 7000 Angstroms.

3. The capacitor claim 1, wherein the polysilicon segment has a thickness from about 1200 Angstroms to about 4000 Angstroms.

4. The capacitor claim 1, wherein the second dielectric layer has a thickness from about 100 Angstroms to about 400 Angstroms.

5. The capacitor claim 1, wherein the first dielectric layer has a thickness from about 3000 Angstroms to about 13000 Angstroms.

6. The capacitor claim 1, wherein the second dielectric layer is an oxide nitride oxide stack.

7. The capacitor of claim 1, further comprising a metal segment on the second dielectric layer over the opening, wherein the metal segment forms a top-plate for the capacitor and the polysilicon segment forms a bottom-plate for the capacitor.

8. The capacitor claim 7, wherein the metal segment has a thickness from about 100 Angstroms to about 500 Angstroms.

9. The capacitor of claim 1, wherein the capacitor comprises a metal-to-polysilicon capacitor, in and on a silicon substrate, on an integrated circuit having MOSFET.

10. A metal-to-polysilicon capacitor, in and on a silicon substrate, on an integrated circuit having MOSFET devices, comprising:
   a field oxide layer on the substrate;
   a polysilicon segment on the field oxide layer;
   a first dielectric layer on the field oxide layer and the polysilicon segment, wherein an opening is present in the first dielectric layer to expose a portion of the polysilicon segment, which is subjected to doping thereon;
   a second dielectric layer having a first side and a second side, the first side being substantially in contact with the polysilicon segment and the second side being in contact with a top-plate of the metal-to-polysilicon capacitor; and
   a contact to the portion of the polysilicon segment out of contact with the second dielectric layer,
   wherein the polysilicon segment is initially part of a polysilicon layer formed in common with other elements of the integrated circuit.

11. The metal polysilicon capacitor of claim 10, wherein the second dielectric layer being made out of same dielectric material, laid on the polysilicon segment exposed in the opening and on the first dielectric layer wherein a portion of the polysilicon segment is out of contact with the second dielectric layer.

12. The metal polysilicon capacitor of claim 10, further comprising a metal segment on the second dielectric layer over the opening.

13. The metal-to-polysilicon capacitor claim 12, wherein the metal segment has a thickness from about 100 Angstroms to about 500 Angstroms.

14. The metal polysilicon capacitor of claim 12, wherein the metal segment forms a top-plate for the metal-to-polysilicon capacitor and the polysilicon segment forms a bottom-plate for the metal-to-polysilicon capacitor.

15. The metal-to-polysilicon capacitor of claim 10, wherein the contact includes:
   a hole in the first dielectric layer to the polysilicon segment;
   a metal disposed to being placed into the hole thereby forming a metal plug;
   a metal contact on top of the metal plug.

16. The metal-to-polysilicon capacitor of claim 10, wherein the field oxide layer has a thickness from about 2000 Angstroms to about 7000 Angstroms.

17. The metal-to-polysilicon capacitor claim 10, wherein the polysilicon segment has a thickness from about 1200 Angstroms to about 4000 Angstroms.

18. The metal-to-polysilicon capacitor claim 10, wherein the second dielectric layer has a thickness from about 100 Angstroms to about 400 Angstroms.

19. The metal-to-polysilicon capacitor claim 10, wherein the first dielectric layer has a thickness from about 3000 Angstroms to about 13000 Angstroms.

20. The metal-to-polysilicon capacitor claim 10, wherein the second dielectric layer is an oxide nitride oxide stack.

* * * * *